(12) United States Patent
Jeddeloh

(10) Patent No.: US 7,689,879 B2
(45) Date of Patent: *Mar. 30, 2010

(54) SYSTEM AND METHOD FOR ON-BOARD TIMING MARGIN TESTING OF MEMORY MODULES

(75) Inventor: Joseph M. Jeddeloh, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 903 days.

This patent is subject to a terminal disclaimer.

(21) Appl. No.: 11/431,437

(22) Filed: May 9, 2006

(65) Prior Publication Data

US 2006/0206761 A1    Sep. 14, 2006

Related U.S. Application Data

(63) Continuation of application No. 10/660,844, filed on Sep. 12, 2003, now Pat. No. 7,310,752.

(51) Int. Cl.
*G11C 29/00* (2006.01)
*G11C 7/00* (2006.01)
*G06F 11/00* (2006.01)

(52) U.S. Cl. .................. 714/718; 714/742; 365/201

(58) Field of Classification Search ................ 714/715, 714/718, 719, 742; 365/200–201
See application file for complete search history.

(56) References Cited

U.S. PATENT DOCUMENTS

| | | | |
|---|---|---|---|
| 4,045,781 A | 8/1977 | Levy et al. | 364/200 |
| 4,084,225 A | 4/1978 | Anderson et al. | 364/200 |
| 4,240,143 A | 12/1980 | Besemer et al. | 364/200 |
| 4,245,306 A | 1/1981 | Besemer et al. | 364/200 |

(Continued)

FOREIGN PATENT DOCUMENTS

EP    0849685 A2    6/1998

(Continued)

OTHER PUBLICATIONS

"Free On-Line Dictionary of Computing" entry Flash Erasable Programmable Read-Only Memory, online May 17, 2004 [http://foldoc.doc.ic.ac.uk/foldoc/foldoc.cgi?flash+memory].

(Continued)

*Primary Examiner*—Cynthia Britt
(74) *Attorney, Agent, or Firm*—Dorsey & Whitney LLP

(57) ABSTRACT

A memory module includes several memory devices coupled to a memory hub. The memory hub includes several link interfaces coupled to respective processors, several memory controller coupled to respective memory devices, a cross-bar switch coupling any of the link interfaces to any of the memory controllers, a write buffer and read cache for each memory device and a self-test module. The self-test module includes a pattern generator producing write data having a predetermined pattern, and a flip-flop having a data input receiving the write data. A clock input of the flip-flop receives an internal clock signal from a delay line that receives a variable frequency clock generator. Read data are coupled from the memory devices and their pattern compared to the write data pattern. The delay of the delay line and frequency of the clock signal can be varied to test the speed margins of the memory devices.

46 Claims, 3 Drawing Sheets

U.S. PATENT DOCUMENTS

| | | | |
|---|---|---|---|
| 4,253,144 A | 2/1981 | Bellamy et al. | 364/200 |
| 4,253,146 A | 2/1981 | Bellamy et al. | 364/200 |
| 4,707,823 A | 11/1987 | Holdren et al. | 370/1 |
| 4,724,520 A | 2/1988 | Athanas et al. | 364/200 |
| 4,930,128 A | 5/1990 | Suzuki et al. | 371/12 |
| 4,953,930 A | 9/1990 | Ramsey et al. | 350/96.11 |
| 5,123,016 A * | 6/1992 | Muller et al. | 714/711 |
| 5,241,506 A | 8/1993 | Motegi et al. | 365/210 |
| 5,243,703 A | 9/1993 | Farmwald et al. | 395/325 |
| 5,251,303 A | 10/1993 | Fogg, Jr. et al. | 395/275 |
| 5,269,022 A | 12/1993 | Shinjo et al. | 395/700 |
| 5,274,584 A | 12/1993 | Henderson et al. | 365/64 |
| 5,287,343 A | 2/1994 | Nakamura et al. | 370/13.1 |
| 5,317,752 A | 5/1994 | Jewett et al. | 395/750 |
| 5,319,755 A | 6/1994 | Farmwald et al. | 395/325 |
| 5,349,587 A | 9/1994 | Nadeau-Dostie et al. | 371/22.3 |
| 5,355,391 A | 10/1994 | Horowitz et al. | 375/36 |
| 5,432,823 A | 7/1995 | Gasbarro et al. | 375/356 |
| 5,432,907 A | 7/1995 | Picazo, Jr. et al. | 395/200 |
| 5,442,770 A | 8/1995 | Barratt | 395/403 |
| 5,450,578 A | 9/1995 | Mackenthun | 395/182.02 |
| 5,461,627 A | 10/1995 | Rypinski | 370/95.2 |
| 5,465,229 A | 11/1995 | Bechtolsheim et al. | 345/477 |
| 5,479,370 A | 12/1995 | Furuyama et al. | 365/189.12 |
| 5,497,476 A | 3/1996 | Oldfield et al. | 395/439 |
| 5,502,621 A | 3/1996 | Schumacher et al. | 361/760 |
| 5,544,319 A | 8/1996 | Acton et al. | 395/200.07 |
| 5,566,325 A | 10/1996 | Bruce, II et al. | 395/494 |
| 5,572,722 A | 11/1996 | Vogley | 395/555 |
| 5,577,220 A | 11/1996 | Combs et al. | 395/416 |
| 5,581,482 A | 12/1996 | Wiedenman et al. | 364/551.01 |
| 5,581,767 A | 12/1996 | Katsuki et al. | 395/800 |
| 5,606,717 A | 2/1997 | Farmwald et al. | 395/856 |
| 5,619,676 A | 4/1997 | Fukuda et al. | 395/464 |
| 5,621,739 A | 4/1997 | Sine et al. | 371/22.1 |
| 5,638,334 A | 6/1997 | Farmwald et al. | 365/230.03 |
| 5,659,798 A | 8/1997 | Blumrich et al. | 395/846 |
| 5,715,456 A | 2/1998 | Bennett et al. | 395/652 |
| 5,729,709 A | 3/1998 | Harness | 395/405 |
| 5,768,152 A | 6/1998 | Battaline et al. | 364/551.01 |
| 5,790,048 A | 8/1998 | Hsieh et al. | 340/825.79 |
| 5,793,776 A | 8/1998 | Qureshi et al. | 371/22.1 |
| 5,818,844 A | 10/1998 | Singh et al. | 370/463 |
| 5,819,304 A | 10/1998 | Nilsen et al. | 711/5 |
| 5,822,255 A | 10/1998 | Uchida | 365/194 |
| 5,832,250 A | 11/1998 | Whittaker | 395/471 |
| 5,875,352 A | 2/1999 | Gentry et al. | 395/843 |
| 5,875,454 A | 2/1999 | Craft et al. | 711/113 |
| 5,905,858 A | 5/1999 | Jeddeloh | 395/185.05 |
| 5,912,852 A | 6/1999 | Lawrence et al. | 365/201 |
| 5,914,902 A | 6/1999 | Lawrence et al. | 365/201 |
| 5,928,343 A | 7/1999 | Farmwald et al. | 710/104 |
| 5,959,914 A | 9/1999 | Gates et al. | 365/201 |
| 5,966,724 A | 10/1999 | Ryan | 711/105 |
| 5,973,935 A | 10/1999 | Schoenfeld et al. | 361/813 |
| 5,973,951 A | 10/1999 | Bechtolsheim et al. | 365/52 |
| 5,978,567 A | 11/1999 | Rebane et al. | 395/200.49 |
| 6,023,726 A | 2/2000 | Saksena | 709/219 |
| 6,029,250 A | 2/2000 | Keeth | 713/400 |
| 6,033,951 A | 3/2000 | Chao | 438/253 |
| 6,061,263 A | 5/2000 | Boaz et al. | 365/51 |
| 6,061,296 A | 5/2000 | Ternullo, Jr. et al. | 365/233 |
| 6,067,262 A | 5/2000 | Irrinki et al. | 365/201 |
| 6,073,190 A | 6/2000 | Rooney | 710/56 |
| 6,076,139 A | 6/2000 | Welker et al. | 711/104 |
| 6,079,008 A | 6/2000 | Clery, III | 712/11 |
| 6,098,158 A | 8/2000 | Lay et al. | 711/162 |
| 6,105,075 A | 8/2000 | Ghaffari | 710/5 |
| 6,125,431 A | 9/2000 | Kobayashi | 711/154 |
| 6,137,709 A | 10/2000 | Boaz et al. | 365/51 |
| 6,144,587 A | 11/2000 | Yoshida | 365/189.05 |
| 6,167,465 A | 12/2000 | Parvin et al. | 710/22 |
| 6,167,486 A | 12/2000 | Lee et al. | 711/120 |
| 6,173,388 B1 | 1/2001 | Abercrombie et al. | 712/22 |
| 6,175,571 B1 | 1/2001 | Haddock et al. | 370/423 |
| 6,185,352 B1 | 2/2001 | Hurley | 385/114 |
| 6,186,400 B1 | 2/2001 | Dvorkis et al. | 235/462.45 |
| 6,191,663 B1 | 2/2001 | Hannah | 333/17.3 |
| 6,201,724 B1 | 3/2001 | Ishizaki et al. | 365/49 |
| 6,205,564 B1 | 3/2001 | Kim et al. | 714/48 |
| 6,233,376 B1 | 5/2001 | Updegrove | 385/14 |
| 6,243,769 B1 | 6/2001 | Rooney | 710/56 |
| 6,243,831 B1 | 6/2001 | Mustafa et al. | 714/24 |
| 6,246,618 B1 | 6/2001 | Yamamoto et al. | 365/200 |
| 6,247,107 B1 | 6/2001 | Christie | 711/216 |
| 6,249,802 B1 | 6/2001 | Richardson et al. | 709/200 |
| 6,256,692 B1 | 7/2001 | Yoda et al. | 710/104 |
| 6,272,609 B1 | 8/2001 | Jeddeloh | 711/169 |
| 6,285,349 B1 | 9/2001 | Smith | 345/147 |
| 6,294,937 B1 | 9/2001 | Crafts et al. | 327/158 |
| 6,301,637 B1 | 10/2001 | Krull et al. | 711/112 |
| 6,327,642 B1 | 12/2001 | Lee et al. | 711/120 |
| 6,330,205 B2 | 12/2001 | Shimizu et al. | 365/230.06 |
| 6,347,055 B1 | 2/2002 | Motomura | 365/189.05 |
| 6,349,363 B2 | 2/2002 | Cai et al. | 711/129 |
| 6,351,834 B1 | 2/2002 | Maekawa et al. | 714/718 |
| 6,356,573 B1 | 3/2002 | Jonsson et al. | 372/46 |
| 6,367,074 B1 | 4/2002 | Bates et al. | 717/11 |
| 6,370,068 B2 | 4/2002 | Rhee | 365/196 |
| 6,373,777 B1 | 4/2002 | Suzuki | 365/230.03 |
| 6,381,190 B1 | 4/2002 | Shinkai | 365/230.03 |
| 6,392,653 B1 | 5/2002 | Malandain et al. | 345/501 |
| 6,401,213 B1 | 6/2002 | Jeddeloh | 713/401 |
| 6,405,280 B1 | 6/2002 | Ryan | 711/105 |
| 6,421,744 B1 | 7/2002 | Morrison et al. | 710/22 |
| 6,430,696 B1 | 8/2002 | Keeth | 713/503 |
| 6,434,639 B1 | 8/2002 | Haghighi | 710/39 |
| 6,434,696 B1 | 8/2002 | Kang | 713/2 |
| 6,434,736 B1 | 8/2002 | Schaecher et al. | 716/17 |
| 6,438,622 B1 | 8/2002 | Haghighi et al. | 710/1 |
| 6,438,668 B1 | 8/2002 | Esfahani et al. | 711/165 |
| 6,446,174 B1 | 9/2002 | Dow | 711/154 |
| 6,449,308 B1 | 9/2002 | Knight, Jr. et al. | 375/212 |
| 6,453,393 B1 | 9/2002 | Holman et al. | 711/154 |
| 6,462,978 B2 | 10/2002 | Shibata et al. | 365/63 |
| 6,463,059 B1 | 10/2002 | Movshovich et al. | 370/389 |
| 6,470,422 B2 | 10/2002 | Cai et al. | 711/129 |
| 6,473,828 B1 | 10/2002 | Matsui | 711/104 |
| 6,477,592 B1 | 11/2002 | Chen et al. | 710/52 |
| 6,477,614 B1 | 11/2002 | Leddige et al. | 711/5 |
| 6,477,621 B1 | 11/2002 | Lee et al. | 711/120 |
| 6,479,322 B2 | 11/2002 | Kawata et al. | 438/109 |
| 6,487,648 B1 | 11/2002 | Hassoun | 711/167 |
| 6,490,188 B2 | 12/2002 | Nuxoll et al. | 365/63 |
| 6,493,803 B1 | 12/2002 | Pham et al. | 711/147 |
| 6,496,909 B1 | 12/2002 | Schimmel | 711/163 |
| 6,501,471 B1 | 12/2002 | Venkataraman et al. | 345/424 |
| 6,505,287 B2 | 1/2003 | Uematsu | 711/170 |
| 6,523,092 B1 | 2/2003 | Fanning | 711/134 |
| 6,523,093 B1 | 2/2003 | Bogin et al. | 711/137 |
| 6,539,490 B1 | 3/2003 | Forbes et al. | 713/401 |
| 6,552,564 B1 | 4/2003 | Forbes et al. | 326/30 |
| 6,587,912 B2 | 7/2003 | Leddige et al. | 711/5 |
| 6,590,816 B2 | 7/2003 | Perner | 365/200 |
| 6,594,713 B1 | 7/2003 | Fuoco et al. | 710/31 |
| 6,594,722 B1 | 7/2003 | Willke, II et al. | 710/313 |
| 6,598,154 B1 | 7/2003 | Vaid et al. | 712/237 |
| 6,615,325 B2 | 9/2003 | Mailloux et al. | 711/154 |
| 6,622,227 B2 | 9/2003 | Zumkehr et al. | 711/167 |
| 6,625,702 B2 | 9/2003 | Rentschler et al. | 711/154 |
| 6,628,294 B1 | 9/2003 | Sadowsky et al. | 345/568 |
| 6,629,220 B1 | 9/2003 | Dyer | 711/158 |
| 6,631,440 B2 | 10/2003 | Jenne et al. | 711/105 |
| 6,636,110 B1 | 10/2003 | Ooishi et al. | 327/565 |

| | | | |
|---|---|---|---|
| 6,646,929 B1 | 11/2003 | Moss et al. | 365/194 |
| 6,658,509 B1 | 12/2003 | Bonella et al. | 710/100 |
| 6,662,304 B2 | 12/2003 | Keeth et al. | 713/400 |
| 6,667,895 B2 | 12/2003 | Jang et al. | 365/63 |
| 6,675,117 B2 | 1/2004 | Adam et al. | 702/106 |
| 6,681,292 B2 | 1/2004 | Creta et al. | 711/119 |
| 6,697,926 B2 | 2/2004 | Johnson et al. | 711/167 |
| 6,718,440 B2 | 4/2004 | Maiyuran et al. | 711/137 |
| 6,721,195 B2 | 4/2004 | Brunelle et al. | 365/63 |
| 6,724,685 B2 | 4/2004 | Braun et al. | 365/233 |
| 6,728,800 B1 | 4/2004 | Lee et al. | 710/54 |
| 6,732,203 B2 | 5/2004 | Kanapathippillai et al. | 710/66 |
| 6,735,679 B1 | 5/2004 | Herbst et al. | 711/167 |
| 6,735,682 B2 | 5/2004 | Segelken et al. | 711/220 |
| 6,745,275 B2 | 6/2004 | Chang | 710/305 |
| 6,751,703 B2 | 6/2004 | Chilton | 711/113 |
| 6,754,117 B2 | 6/2004 | Jeddeloh | 365/201 |
| 6,754,812 B1 | 6/2004 | Abdallah et al. | 712/234 |
| 6,756,661 B2 | 6/2004 | Tsuneda et al. | 257/673 |
| 6,760,833 B1 | 7/2004 | Dowling | 712/34 |
| 6,771,538 B2 | 8/2004 | Shukuri et al. | 365/185.05 |
| 6,775,747 B2 | 8/2004 | Venkatraman | 711/137 |
| 6,782,465 B1 | 8/2004 | Schmidt | 711/208 |
| 6,789,173 B1 | 9/2004 | Tanaka et al. | 711/147 |
| 6,792,059 B2 | 9/2004 | Yuan et al. | 375/354 |
| 6,792,496 B2 | 9/2004 | Aboulenein et al. | 710/306 |
| 6,795,899 B2 | 9/2004 | Dodd et al. | 711/137 |
| 6,799,246 B1 | 9/2004 | Wise et al. | 711/117 |
| 6,799,268 B1 | 9/2004 | Boggs et al. | 712/228 |
| 6,804,760 B2 | 10/2004 | Wiliams | 711/170 |
| 6,804,764 B2 | 10/2004 | LaBerge et al. | 711/170 |
| 6,807,630 B2 | 10/2004 | Lay et al. | 713/2 |
| 6,816,947 B1 | 11/2004 | Huffman | 711/151 |
| 6,820,181 B2 | 11/2004 | Jeddeloh et al. | 711/169 |
| 6,823,023 B1 | 11/2004 | Hannah | 375/296 |
| 6,832,306 B1 | 12/2004 | Ganapathy et al. | 712/41 |
| 6,880,117 B2 | 4/2005 | Lin et al. | 714/717 |
| 6,948,094 B2 | 9/2005 | Schultz et al. | 714/15 |
| 6,970,968 B1 | 11/2005 | Holman | 711/5 |
| 6,972,981 B2 | 12/2005 | Ruckerbauer et al. | 365/63 |
| 7,036,055 B2 | 4/2006 | Muljono et al. | 714/716 |
| 7,155,645 B1 | 12/2006 | Korhonen | 714/718 |
| 7,191,088 B1 | 3/2007 | Reed et al. | 702/130 |
| 7,310,748 B2 | 12/2007 | Jeddeloh | 714/42 |
| 7,310,752 B2 * | 12/2007 | Jeddeloh | 714/718 |
| 7,584,336 B2 | 9/2009 | Tremaine | 711/155 |
| 2001/0013110 A1 | 8/2001 | Pierce et al. | 714/718 |
| 2001/0039612 A1 | 11/2001 | Lee | 713/2 |
| 2002/0013881 A1 | 1/2002 | Delp et al. | 711/105 |
| 2002/0023203 A1 | 2/2002 | Cofler et al. | 712/227 |
| 2002/0046379 A1 | 4/2002 | Miki et al. | 714/749 |
| 2002/0056063 A1 * | 5/2002 | Nerl | 714/733 |
| 2002/0062466 A1 * | 5/2002 | Noguchi | 714/738 |
| 2002/0066052 A1 | 5/2002 | Olarig et al. | 714/42 |
| 2002/0089925 A1 | 7/2002 | Smith et al. | 370/216 |
| 2002/0104043 A1 | 8/2002 | Reynolds et al. | 714/38 |
| 2002/0104045 A1 | 8/2002 | Cooper | 714/42 |
| 2002/0112119 A1 | 8/2002 | Halbert et al. | 711/115 |
| 2002/0116081 A1 | 8/2002 | Wood et al. | 700/87 |
| 2002/0116588 A1 | 8/2002 | Beckert et al. | 711/161 |
| 2002/0144064 A1 | 10/2002 | Fanning | 711/144 |
| 2002/0194558 A1 | 12/2002 | Wang et al. | 714/718 |
| 2002/0199136 A1 | 12/2002 | Ku | 714/30 |
| 2002/0199139 A1 | 12/2002 | Dortu et al. | 714/718 |
| 2003/0005223 A1 | 1/2003 | Coulson et al. | 711/118 |
| 2003/0043158 A1 | 3/2003 | Wasserman et al. | 345/545 |
| 2003/0043426 A1 | 3/2003 | Baker et al. | 359/109 |
| 2003/0046628 A1 | 3/2003 | Rankin et al. | 714/752 |
| 2003/0056038 A1 | 3/2003 | Cochran | 710/36 |
| 2003/0074601 A1 | 4/2003 | Schultz et al. | 714/15 |
| 2003/0093630 A1 | 5/2003 | Richard et al. | 711/154 |
| 2003/0163649 A1 | 8/2003 | Kapur et al. | 711/146 |
| 2003/0177320 A1 | 9/2003 | Sah et al. | 711/158 |
| 2003/0193927 A1 | 10/2003 | Hronik | 370/351 |
| 2003/0229770 A1 | 12/2003 | Jeddeloh | 711/213 |
| 2003/0233601 A1 | 12/2003 | Vaid et al. | 714/42 |
| 2004/0022094 A1 | 2/2004 | Radhakrishnan et al. | 365/200 |
| 2004/0122911 A1 | 6/2004 | Chong, Jr. et al. | 709/217 |
| 2004/0123043 A1 | 6/2004 | Rotithor et al. | 711/137 |
| 2004/0123180 A1 | 6/2004 | Soejima et al. | 714/5 |
| 2004/0128433 A1 | 7/2004 | Bains | 711/106 |
| 2004/0199843 A1 * | 10/2004 | Hansquine et al. | 714/733 |
| 2004/0216018 A1 | 10/2004 | Cheung | 714/724 |
| 2004/0237001 A1 | 11/2004 | Schulz et al. | 714/42 |
| 2005/0021884 A1 | 1/2005 | Jeddeloh | 710/22 |
| 2005/0044457 A1 | 2/2005 | Jeddeloh | 714/718 |
| 2005/0066113 A1 | 3/2005 | Rajamony et al. | 711/105 |
| 2005/0144403 A1 | 6/2005 | Jeddeloh | 711/154 |
| 2005/0210185 A1 | 9/2005 | Renick | 711/105 |
| 2005/0243829 A1 | 11/2005 | Spencer | 370/394 |
| 2005/0283681 A1 | 12/2005 | Jeddeloh | 714/42 |
| 2006/0075282 A1 | 4/2006 | Borkenhagen et al. | 714/5 |
| 2006/0206766 A1 | 9/2006 | Jeddeloh | 714/42 |

FOREIGN PATENT DOCUMENTS

| | | |
|---|---|---|
| KR | 2006021440 A * | 3/2006 |
| WO | WO 93/19422 | 9/1993 |
| WO | WO 02/27499 A2 | 4/2002 |

OTHER PUBLICATIONS

Intel, "Flash Memory PCI Add-In Card for Embedded Systems", Application Note AP-758, Sep. 1997, pp. i-13.

Intel, "Intel 840 Chipset: 82840 Memory Controller Hub (MCH)", Datasheet, www.intel.com/design/chipsets/datashts/298020.htm, Oct. 1999, pp. 1-178.

Micron Technology, Inc., "Synchronous DRAM Module 512MB/1GB (x72, ECC) 168-PIN Registered FBGA SDRAM DIMM", Micron Technology, Inc., 2002, pp. 1-23.

Shanley, T. et al., "PCI System Architecture", Third Edition, Mindshare, Inc., 1995, pp. 24-25.

* cited by examiner

SYSTEM AND METHOD FOR ON-BOARD TIMING MARGIN TESTING OF MEMORY MODULES

CROSS-REFERENCE TO RELATED APPLICATION

This application is a continuation of pending U.S. patent application Ser. No. 10/660,844, filed Sep. 12, 2003.

TECHNICAL FIELD

The present invention relates to a processor-based system, and more particularly, to a processor-based system having a memory module with a memory hub coupling several memory devices to a processor or other memory access devices.

BACKGROUND OF THE INVENTION

Processor-based systems, such as computer systems, use memory devices, such as dynamic random access memory ("DRAM") devices, to store instructions and data that are accessed by a processor. These memory devices are typically used as system memory in a computer system. In a typical computer system, the processor communicates with the system memory through a processor bus and a memory controller. The processor issues a memory request, which includes a memory command, such as a read command, and an address designating the location from which data or instructions are to be read. The memory controller uses the command and address to generate appropriate command signals as well as row and column addresses, which are applied to the system memory. In response to the commands and addresses, data is transferred between the system memory and the processor. The memory controller is often part of a system controller, which also includes bus bridge circuitry for coupling the processor bus to an expansion bus, such as a PCI bus.

Although the operating speed of memory devices has continuously increased, this increase in operating speed has not kept pace with increases in the operating speed of processors. Even slower has been the increase in operating speed of memory controllers coupling processors to memory devices. The relatively slow speed of memory controllers and memory devices limits the data bandwidth between the processor and the memory devices.

In addition to the limited bandwidth between processors and memory devices, the performance of computer systems is also limited by latency problems that increase the time required to read data from system memory devices. More specifically, when a memory device read command is coupled to a system memory device, such as a synchronous DRAM ("SDRAM") device, the read data are output from the SDRAM device only after a delay of several clock periods. Therefore, although SDRAM devices can synchronously output burst data at a high data rate, the delay in initially providing the data can significantly slow the operating speed of a computer system using such SDRAM devices.

One approach to alleviating the memory latency problem is to use multiple memory devices coupled to the processor through a memory hub. In a memory hub architecture, a system controller or memory hub controller is coupled to several memory modules, each of which includes a memory hub coupled to several memory devices. The memory hub efficiently routes memory requests and responses between the controller and the memory devices. Computer systems employing this architecture can have a higher bandwidth because a processor can access one memory module while another memory module is responding to a prior memory access. For example, the processor can output write data to one of the memory modules in the system while another memory module in the system is preparing to provide read data to the processor. The operating efficiency of computer systems using a memory hub architecture can make it more practical to vastly increase data bandwidth of a memory system. A memory hub architecture can also provide greatly increased memory capacity in computer systems.

Although there are advantages to utilizing a memory hub for accessing memory devices, the design of the hub memory system, and more generally, computer systems including such a memory hub architecture, becomes increasingly difficult. For example, in many hub based memory systems, the processor is coupled to the memory via a high speed bus or link over which signals, such as command, address, or data signals, are transferred at a very high rate. However, as transfer rates increase, the time for which a signal represents valid information is decreasing. As commonly referenced by those ordinarily skilled in the art, the window or "eye" for when the signals are valid decreases at higher transfer rates. With specific reference to data signals, the "data eye" decreases. As understood by one skilled in the art, the data eye for each of the data signals defines the actual duration that each signal is valid after various factors affecting the signal are considered, such as timing skew, voltage and current drive capability, and the like. In the case of timing skew of signals, it often arises from a variety of timing errors such as loading on the lines of the bus and the physical lengths of such lines.

As data eyes of the signals decrease at higher transfer rates, it is possible that one or more of a group of signals provided in parallel will have arrival times such that not all signals are simultaneously valid at a receiving entity, and thus cannot be successfully captured that entity. For example, where a plurality of signals are provided in parallel over a bus, the data eye of one or more of the particular signals do not overlap with the data eyes of the other signals. In this situation, the signals having non-overlapping data eyes are not valid at the same time as the rest of the signals, and consequently, cannot be successfully captured by the receiving entity.

Clearly, as those ordinarily skilled in the art will recognize, the previously described situation is unacceptable. As it is further recognized by those familiar in the art of high speed digital systems, signal timing is an issue that has become increasingly more significant in the design of systems capable of transferring and transmitting information at high speeds because signal timing can be affected by many things. As a result, testing memory devices that are subject to variations in the timing relationships between signals, whether command, address, or data signals, is becoming a more critical step in the production of memory devices that are to be used in a high-speed digital system.

Production testing is typically accomplished using sophisticated testing equipment that is coupled to several memory devices to simultaneously test the devices. During testing, the testing equipment couples signals to and from integrated circuit nodes sometimes using a test probe that makes electrical contact with the circuit nodes. However, such probes can introduce loading effects that change the characteristic of the signals being evaluated. Although probes are specifically designed to have high impedance and low capacitance to minimize loading issues and the introduction of noise, there is still in many cases, an unacceptable level of loading that changes the character of a signal to such a degree that it cannot be accurately evaluated. Also, the propagation delays in coupling signals between the integrated circuit nodes and the test equipment may introduce delays that make it impossible to accurately determine timing relationships within the integrated circuit. For example, the testing equipment may apply memory command and address signals to the memory device with a specific range of timing relationships to write data signals that are also applied to the memory device. If the memory device is able to properly read the write data, the assumption is made that the memory device is able to operate within this range of timing relationships. However, there can be no assurance that the command and address signals and the write data signals are actually coupled to circuit nodes in the memory device with this same range of timing relationships. Therefore, the memory device may not actually function properly with the timing relationships that were used during the testing.

The difficulty in accurately controlling and/or determining the actual timing relationships between signals applied to or internal to memory devices is exacerbated when the memory devices are accessible only through interface circuitry. For example, where several memory devices are coupled to a memory hub, the memory devices are accessible only through the memory hub. Although production testing equipment may be able to accurately control and determine the timing relationships between signals applied to the interface circuitry, such equipment cannot control or determine the timing relationships of the signals in the memory devices after the devices have been packaged with the interface circuitry so that the signals coupled to and from the memory devices must be coupled through the interface circuitry.

Another problem that can be encountered in testing high-speed memory devices using conventional production testing equipment is associated with obtaining control over the memory bus in order to perform evaluation. Again, this problem is exacerbated when memory devices are accessible to production testing equipment only through interface circuitry, such as a memory hub. The ability to evaluate a memory system often requires that specific signals of interest can be captured and analyzed by obtaining control of the memory bus and monitoring the interaction of the signal with the bus itself. Unless control over the memory bus can be obtained, analysis becomes a difficult task. However, obtaining control over the memory bus is a difficult task in itself because conventional approaches often interfere with the normal operation of the computer system, thus, preventing accurate analysis of the memory system under true, normal operating conditions.

There is therefore a need for a system and method that allows memory devices to be tested through interface circuitry in a manner that does not affect the normal operation of the memory device and that provides accurate control and determination of timing relationships between signals applied to or received from the memory device. In particularly, there is a need for a system and method that allows the timing relationships between signals applied to or received from memory devices to be controlled and determined even though the memory devices are contained in a memory hub module.

SUMMARY OF THE INVENTION

A memory module for a processor-based system includes a plurality of memory devices coupled to a memory hub. The memory hub includes a link interface for receiving memory requests for access to the memory devices and at least one memory device interface coupled to the memory devices. The memory device interface couples write memory requests and write data to the memory devices, and couples read memory requests to the memory device and read data from the memory device. The memory hub also includes a self-test module coupled to the memory devices. The self-test module is operable to couple to the memory devices a series of corresponding first and second signals. Significantly, the self-test module alters the relative timing between when some of the corresponding first and second signals in the series are coupled to the memory devices. The self-test module also receives output signals from the memory devices and determines based on the received output signals whether the memory device properly responded to the series of first and second signals. The self-test module may also vary the time when the output signals are registered in the memory hub relative to a strobe signal received with the output signals. The operation of the memory devices may be synchronized to a clock signal generated by the memory hub. The frequency of the clock signal may be varied to verify the operation of the memory devices at an abnormally high operating speed.

DETAILED DESCRIPTION OF THE INVENTION

Embodiments of the present invention are directed to a memory hub module having the capability to self-test signal timing relationships. Certain details are set forth below to provide a sufficient understanding of various embodiments of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 1:
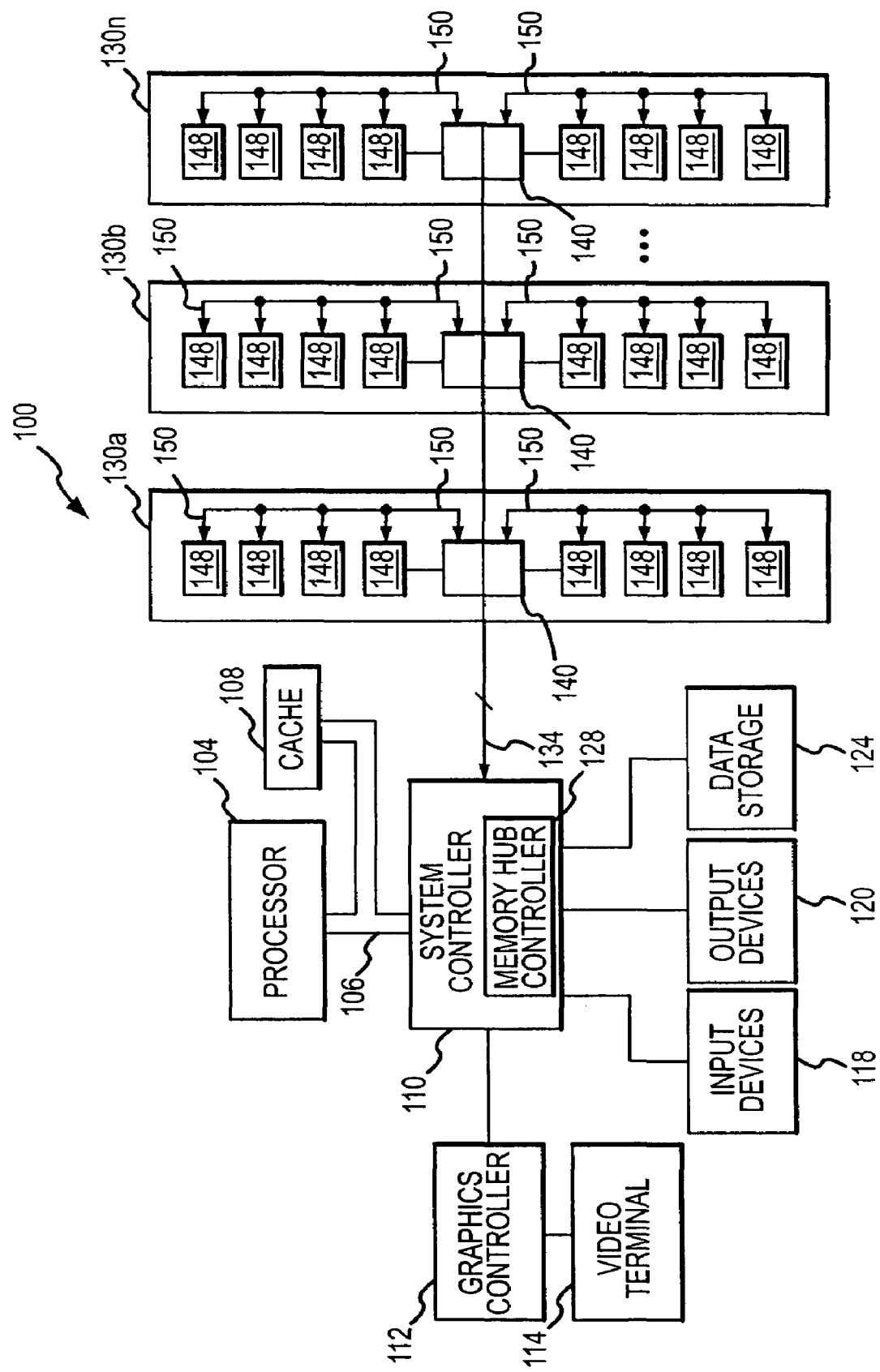
FIG. 1 is a block diagram of a computer system that includes several memory modules having a memory hub architecture according to various embodiments of the present invention.

A computer system 100 according to one embodiment of the invention is shown in FIG. 1. The computer system 100 includes a processor 104 for performing various computing functions, such as executing specific software to perform specific calculations or tasks. The processor 104 includes a processor bus 106 that normally includes an address bus, a control bus, and a data bus. The processor bus 106 is typically coupled to cache memory 108, which, is typically static random access memory ("SRAM"). Finally, the processor bus 106 is coupled to a system controller 110, which is also sometimes referred to as a bus bridge.

The system controller 110 serves as a communications path to the processor 104 for a variety of other components. More specifically, the system controller 110 includes a graphics port that is typically coupled to a graphics controller 112, which is, in turn, coupled to a video terminal 114. The system controller 110 is also coupled to one or more input devices 118, such as a keyboard or a mouse, to allow an operator to interface with the computer system 100. Typically, the computer system 100 also includes one or more output devices 120, such as a printer, coupled to the processor 104 through the system controller 110. One or more data storage devices 124 are also typically coupled to the processor 104 through the system controller 110 to allow the processor 104 to store data or retrieve data from internal or external storage media (not shown). Examples of typical storage devices 124 include hard and floppy disks, tape cassettes, and compact disk read-only memories (CD-ROMs).

The system controller 110 includes a memory hub controller 128 that is coupled to several memory modules 130a,b . . . n, which serve as system memory for the computer system 100. The memory modules 130 are preferably coupled to the memory hub controller 128 through a high-speed link 134, which may be an optical or electrical communication path or some other type of communications path. In the event the high-speed link 134 is implemented as an optical communication path, the optical communication path may be in the form of one or more optical fibers. In such case, the memory hub controller 128 and the memory modules will include an optical input/output port or separate input and output ports coupled to the optical communication path. The memory modules 130 are shown coupled to the memory hub controller 128 in a multi-drop arrangement in which the single high-speed link 134 is coupled to all of the memory modules 130. However, it will be understood that other topologies may also be used. For example, a point-to-point coupling arrangement may be used in which a separate high-speed link (not shown) is used to couple each of the memory modules 130 to the memory hub controller 128. A switching topology may also be used in which the memory hub controller 128 is selectively coupled to each of the memory modules 130 through a switch (not shown). Other topologies that may be used will be apparent to one skilled in the art.

Figure 2:
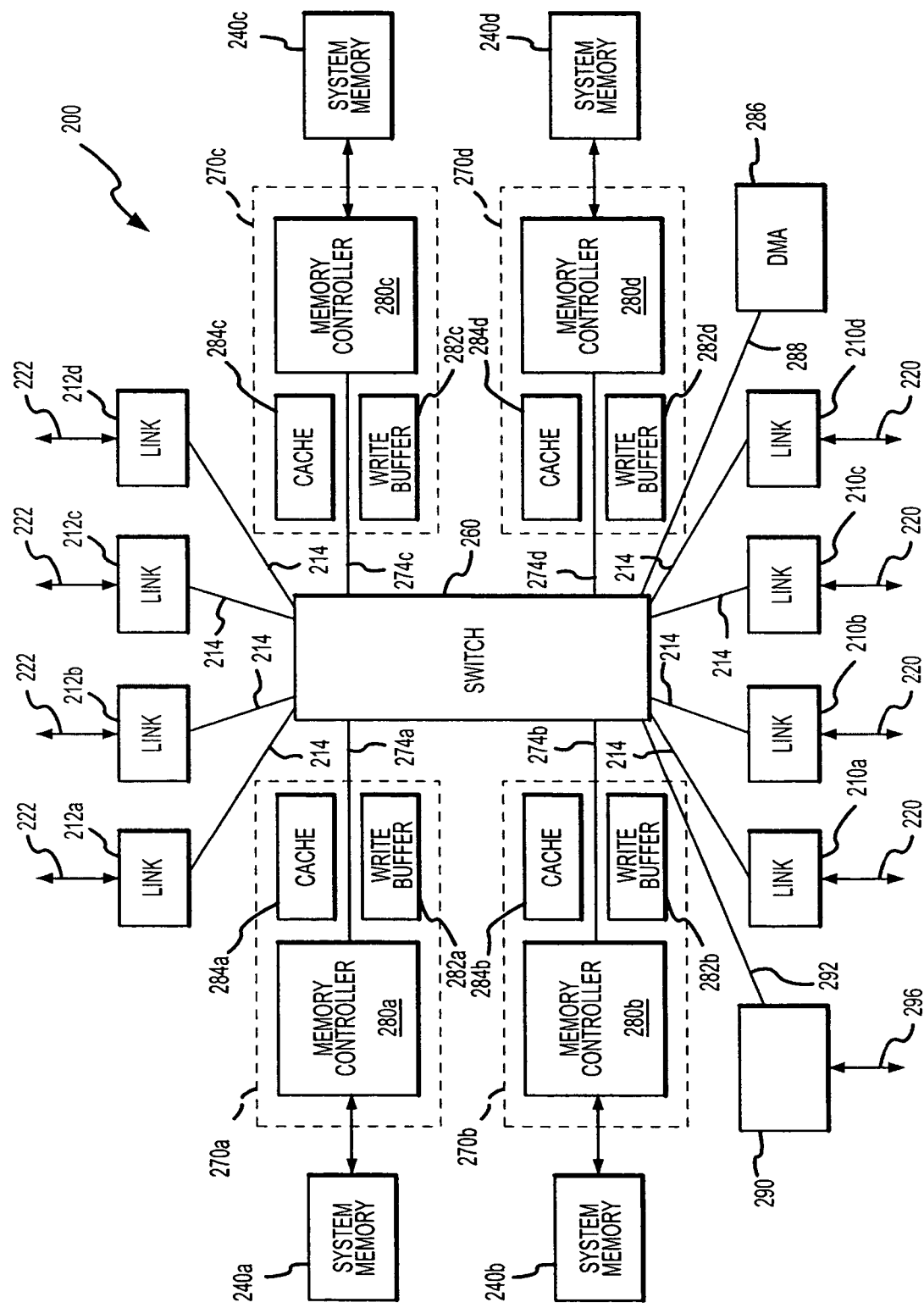
FIG. 2 is a block diagram of a memory hub according to an embodiment of the present invention that may be used with the memory modules in the computer system of FIG. 1 or in some other system.

Each of the memory modules 130 includes a memory hub 140 for controlling access to eight memory devices 148, which, in the example illustrated in FIG. 1, are synchronous dynamic random access memory ("SDRAM") devices. However, a fewer or greater number of memory devices 148 may be used, and memory devices other than SDRAM devices may also be used. The memory hub 140 is coupled to each of the system memory devices 148 through a bus system 150, which normally includes a control bus, an address bus, and a data bus. However, other bus systems, such as a bus system using a shared command/address bus, may also be used FIG. 2 shows an embodiment of a memory hub 200 according to the present invention, which can be used as the memory hub 140 of FIG. 1. The memory hub 200 is being coupled to four memory devices 240a-d, which, in the present example are conventional SDRAM devices. In an alternative embodiment, the memory hub 200 is coupled to four different banks of memory devices, rather than merely four different memory devices 240a-d, with each bank typically having a plurality of memory devices. However, for the purpose of providing an example, the present description will be with reference to the memory hub 200 coupled to the four memory devices 240a-d. It will be appreciated that the necessary modifications to the memory hub 200 to accommodate multiple banks of memory is within the knowledge of those ordinarily skilled in the art.

Further included in the memory hub 200 are link interfaces 210a-d, which may be used to couple the memory hub 200 to respective processors or other memory access devices. In the embodiment shown in FIG. 1, only one memory access device, and hence only on link interface 210a, is used. The memory hub 200 also includes link interfaces 212a-d for coupling the memory module on which the memory hub 200 is located to other memory modules (not shown). These link interfaces 212a-d are not used in the embodiment of FIG. 1. In any case, the link interfaces 210a-d and 212a-d are preferably coupled to a first high speed data link 220 and a second high speed data link 222, respectively. As previously discussed with respect to FIG. 1, the high speed data links 220, 222 can be implemented using an optical or electrical communication path or some other type of communication path. The link interfaces 210a-d, 212a-d are conventional, and include circuitry used for transferring data, command, and address information to and from the high speed data links 220, 222. As well known, such circuitry includes transmitter and receiver logic known in the art. It will be appreciated that those ordinarily skilled in the art have sufficient understanding to modify the link interfaces 210a-d, 212a-d to be used with specific types of communication paths, and that such modifications to the link interfaces 210a-d, 212a-d can be made without departing from the scope of the present invention. For example, in the event the high-speed data link 220, 222 is implemented using an optical communications path, the link interfaces 210a-d, 212a-d will include an optical input/output port that can convert optical signals coupled through the optical communications path into electrical signals.

The link interfaces 210a-d, 212a-d are coupled to a switch 260 through a plurality of bus and signal lines, represented by busses 214. The busses 214 are conventional, and include a write data bus and a read data bus, although a single bi-directional data bus may alternatively be provided to couple data in both directions through the link interfaces 210a-d, 212a-d. It will be appreciated by those ordinarily skilled in the art that the busses 214 are provided by way of example, and that the busses 214 may include fewer or greater signal lines, such as further including a request line and a snoop line, which can be used for maintaining cache coherency.

The link interfaces 210a-d, 212a-d include circuitry that allow the memory hub 140 to be connected in the system memory in a variety of configurations. For example, the multi-drop arrangement, as shown in FIG. 1, can be implemented by coupling each memory module to the memory hub controller 128 through either the link interfaces 210a-d or 212a-d. Alternatively, a point-to-point or daisy chain configuration can be implemented by coupling the memory modules in series. For example, the link interfaces 210a-d can be used to couple a first memory module and the link interfaces 212a-d can be used to couple a second memory module. The memory module coupled to a processor, or system controller, will be coupled thereto through one set of the link interfaces and further coupled to another memory module through the other set of link interfaces. In one embodiment of the present invention, the memory hub 200 of a memory module is coupled to the processor in a point-to-point arrangement in which there are no other devices coupled to the connection between the processor 104 and the memory hub 200. This type of interconnection provides better signal coupling between the processor 104 and the memory hub 200 for several reasons, including relatively low capacitance, relatively few line discontinuities to reflect signals and relatively short signal paths.

The switch 260 is further coupled to four memory interfaces 270a-d which are, in turn, coupled to the memory devices 240a-d, respectively. By providing a separate and independent memory interface 270a-d for each memory device 240a-d, respectively, the memory hub 200 avoids bus or memory bank conflicts that typically occur with single channel memory architectures. The switch 260 is coupled to each memory interface through a plurality of bus and signal lines, represented by busses 274. The busses 274 include a write data bus, a read data bus, and a request line. However, it will be understood that a single bi-directional data bus may alternatively be used instead of a separate write data bus and read data bus. Moreover, the busses 274 can include a greater or lesser number of signal lines than those previously described.

In an embodiment of the present invention, each memory interface 270a-d is specially adapted to the memory devices 240a-d to which it is coupled. More specifically, each memory interface 270a-d is specially adapted to provide and receive the specific signals received and generated, respectively, by the memory device 240a-d to which it is coupled. Also, the memory interfaces 270a-d are capable of operating with memory devices 240a-d operating at different clock frequencies. As a result, the memory interfaces 270a-d isolate the processor 104 from changes that may occur at the interface between the memory hub 230 and memory devices 240a-d coupled to the memory hub 200, and it provides a more controlled environment to which the memory devices 240a-d may interface.

The switch 260 coupling the link interfaces 210a-d, 212a-d and the memory interfaces 270a-d can be any of a variety of conventional or hereinafter developed switches. For example, the switch 260 may be a cross-bar switch that can simultaneously couple link interfaces 210a-d, 212a-d and the memory interfaces 270a-d to each other in a variety of arrangements. The switch 260 can also be a set of multiplexers that do not provide the same level of connectivity as a cross-bar switch but nevertheless can couple the some or all of the link interfaces 210a-d, 212a-d to each of the memory interfaces 270a-d. The switch 260 may also includes arbitration logic (not shown) to determine which memory accesses should receive priority over other memory accesses. Bus arbitration performing this function is well known to one skilled in the art.

With further reference to FIG. 2, each of the memory interfaces 270a-d includes a respective memory controller 280, a respective write buffer 282, and a respective cache memory unit 284. The memory controller 280 performs the same functions as a conventional memory controller by providing control, address and data signals to the memory device 240a-d to which it is coupled and receiving data signals from the memory device 240a-d to which it is coupled. However, the nature of the signals sent and received by the memory controller 280 will correspond to the nature of the signals that the memory devices 240a-d are adapted to send and receive. The cache memory unit 284 includes the normal components of a cache memory, including a tag memory, a data memory, a comparator, and the like, as is well known in the art. The memory devices used in the write buffer 282 and the cache memory unit 284 may be either DRAM devices, static random access memory ("SRAM") devices, other types of memory devices, or a combination of all three. Furthermore, any or all of these memory devices as well as the other components used in the cache memory unit 284 may be either embedded or stand-alone devices.

The write buffer 282 in each memory interface 270a-d is used to store write requests while a read request is being serviced. In such a system, the processor 104 can issue a write request to a system memory device 240a-d even if the memory device to which the write request is directed is busy servicing a prior write or read request. The write buffer 282 preferably accumulates several write requests received from the switch 260, which may be interspersed with read requests, and subsequently applies them to each of the memory devices 240a-d in sequence without any intervening read requests. By pipelining the write requests in this manner, they can be more efficiently processed since delays inherent in read/write turnarounds are avoided. The ability to buffer write requests to allow a read request to be serviced can also greatly reduce memory read latency since read requests can be given first priority regardless of their chronological order.

The use of the cache memory unit 284 in each memory interface 270a-d allows the processor 104 to receive data responsive to a read command directed to a respective system memory device 240a-d without waiting for the memory device 240a-d to provide such data in the event that the data was recently read from or written to that memory device 240a-d. The cache memory unit 284 thus reduces the read latency of the system memory devices 240a-d to maximize the memory bandwidth of the computer system. Similarly, the processor 104 can store write data in the cache memory unit 284 and then perform other functions while the memory controller 280 in the same memory interface 270a-d transfers the write data from the cache memory unit 284 to the system memory device 240a-d to which it is coupled.

Further included in the memory hub 200 is a self-test module 290 coupled to the switch 260 through a test bus 292. The self-test module 290 is further coupled to a maintenance bus 296, such as a System Management Bus (SMBus) or a maintenance bus according to the Joint Test Action Group (JTAG) and IEEE 1149.1 standards. Both the SMBus and JTAG standards are well known by those ordinarily skilled in the art. Generally, the maintenance bus 296 provides a user access to the self-test module 290 in order to set memory testing parameters and receive test results. For example, the user can couple a separate PC host via the maintenance bus 296 to set the relative timing between signals that are applied to the memory devices 240. Similarly, data indicative of the relative timing between signals that are received from the memory devices 240 can be coupled to the PC host via the maintenance bus 296. By using the maintenance bus 296 to set test parameters and output test results, issues related to the use of external testing equipment and test probes, as previously discussed, can be avoided. It will be appreciated that the maintenance bus 296 can be modified from conventional bus standards without departing from the scope of the present invention. It will be further appreciated that the self-test module 290 should accommodate the standards of the maintenance bus 296, where such a standard maintenance bus is employed. For example, the self-test module 296 should have a maintenance bus interface that is compliant with the JTAG bus standard where such a maintenance bus 292 is used.

Further included in the memory hub 200 may be a DMA engine 286 coupled to the switch 260 through a bus 288. The DMA engine 286 enables the memory hub 200 to move blocks of data from one location in the system memory to another location in the system memory without intervention from the processor 104. The bus 288 includes a plurality of conventional bus lines and signal lines, such as address, control, data busses, and the like, for handling data transfers in the system memory. Conventional DMA operations well known by those ordinarily skilled in the art can be implemented by the DMA engine 286. A more detailed description of a suitable DMA engine can be found in commonly assigned, co-pending U.S. patent application Ser. No. 10/625,132, entitled APPARATUS AND METHOD FOR DIRECT MEMORY ACCESS IN A HUB-BASED MEMORY SYSTEM, filed on Jul. 22, 2003, which is incorporated herein by reference. As described in more detail in the aforementioned patent application, the DMA engine 286 is able to read a link list in the system memory to execute the DMA memory operations without processor intervention, thus, freeing the processor 104 and the bandwidth limited system bus from executing the memory operations. The DMA engine 286 can also include circuitry to accommodate DMA operations on multiple channels, for example, for each of the system memory devices 240a-d. Such multiple channel DMA engines are well known in the art and can be implemented using conventional technologies.

The self-test module 290 and the DMA engine 286 are preferably embedded circuits in the memory hub 200. However, including a separate self-test module 290 and a separate DMA engine 286 coupled to the memory hub 200 is also within the scope of the present invention.

Embodiments of the present invention provide an environment for varying the timing and timing relationships of signals applied to the memory devices 240, as well as determining the timing and timing relationships between signals received from the memory devices 240. For example, the self-test module 290 may cause a clock signal having a variable frequency to be applied to the memory devices 240 in the event, for example, that the memory devices 240 are synchronous memory devices, such as SDRAMs. By ensuring during production testing that the memory devices 240 can operate properly at an abnormally high frequency, the memory devices 240 can be counted on to operate at a lower clock frequency during normal operation. As another example, the self-test module 290 can cause a data signals to be abnormally skewed relative to a data strobe signal during production testing. If the memory device 240 operates properly with this timing skew, it can reasonably be assured of operating properly in the presence of normal signal skews. Varying the timing or relative timing of signals also allows for "speed grading" of memory modules during production testing. Other variations in the timing of signals or the relative timing of signals for test purposes will be apparent to one skilled in the art.

Figure 3:
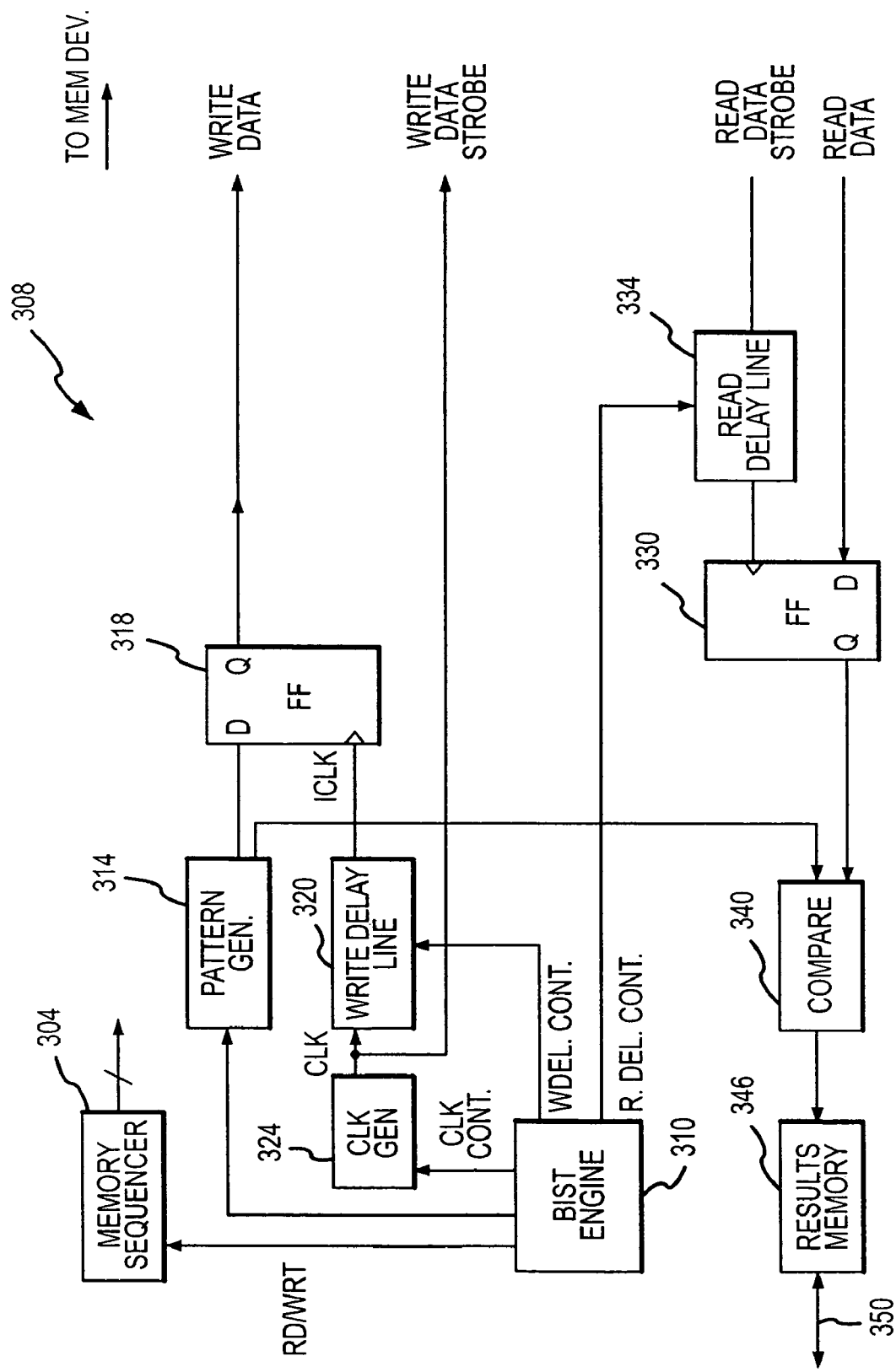
FIG. 3 is a block diagram of one embodiment of a self test module used in the memory hub of FIG. 2.

FIG. 3 illustrates a self-test module 300 according to an embodiment of the present invention that can be used as the self-test module 296 shown in FIG. 2. It will be appreciated that FIG. 3 is a functional block diagram representative of a suitable self-test module and is not intended to limit the scope of the present invention. The functional blocks shown in FIG. 3 are conventional, and can be implemented using well known techniques and circuitry. It will be further appreciated that control signals and other functional blocks have been omitted from FIG. 3 in order to avoid unnecessarily obscuring the present invention, and that the description provided herein is sufficient to enable those ordinarily skilled in the art to practice the invention.

Included in the self-test module 300 is a memory sequencer 304 that generates properly timed signals for controlling the operation of the memory devices 240 (FIG. 2). However, in alternative embodiments, the DMA engine 286 may be used for this purpose. The nature of the signals generated by the memory sequencer 304 will, of course, be determined by the nature of the signals used by the memory devices 240. The self-test module 300 is operated primarily by a BIST engine 310, which may be a logic circuit, such as a state machine, a simple processor executing test code, or some other type of device. As will be explained, the BIST engine 310 determines the timing relationship between signals applied to the memory devices 240.

One output of BIST engine 310 is applied to a pattern generator 314 of conventional design that generates signals corresponding to a pattern of data that will be written to one of the memory devices 240. The data signals from the pattern generator 314 are applied to flip-flops 318 (represented by the single flip-flop 318 shown in FIG. 3), which is clocked by an internal CLK signal ("ICLK") generated at the output of a write delay line 320. The delay line 240, in turn, receives a CLK signal produced by a clock generator 324. The CLK signal is delayed to produce the ICLK signal by a magnitude determined by a delay control signal from the BIST engine 310. The frequency of the CLK signal produced by the clock generator 324 preferably varies and is determined by a clock control signal from the BIST engine 310. Thus, data signals are output from the flip-flops 318 at a variable rate, as determined by the clock control signal, and/or at a variable timing, as determined by the delay control signal. The data signals from the flip-flops 318 are applied to data input terminals of the memory devices 240 along with the CLK signal, which may serve as a write data strobe signal.

Although not specifically shown in FIG. 3, the self-test module 300 can also vary the timing and rate at which control and address signals are applied to the memory devices 240 along with the CLK signal or other timing signal.

Read data from the memory device 240 is applied to the data input of a flip-flop 330, which also receives a delayed read data strobe signal at the output of a read delay line 334. The delay line 334 receives a read data strobe signal from the memory device 240. The magnitude of the delay provided by the read delay line 334 is determined by a read delay control signal coupled from the BIST engine 310. The flip-flop 330 then applies the read data to a compare circuit 340. The compare circuit 340 receives not only the read data from the memory device 240, but also receives the pattern of data from the pattern generator 314. The compare circuit 340 compares the pattern of write data coupled through the flip-flop 318 to the pattern of read data coupled through the flip-flop 330 to determine whether the memory device 240 was able to correctly store the write data. The results of the data comparison are then output from the compare circuit 340 and stored in a results memory 346, which may be a static random access memory ("SRAM") device. The results memory 346 stores results data for one or more data patterns stored in the memory device 240, and then couples the stored results data from the results memory 346, preferably through a maintenance port 350.

In operation, the BIST engine 310 adjusts the delay of the write delay line 320 to skew the write data signals from the write flip-flop 318 in relation to the write strobe signal generated from the ICLK signal. By ensuring that data can be stored in the memory device 240 during production testing despite abnormal variations in the timing between the write data signals and the write strobe signal, the manufacturer of the memory modules can be assured that the memory module will perform satisfactory in normal use. Similarly, the BIST engine 310 adjusts the delay of the read delay line 334 during production testing to vary the timing of the read data signals relative to the read data strobe. Further, the self-test module 300 can perform these operations at an abnormally high operating speed by increasing the frequency of the CLK signal generated by the clock generator 324.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory module, comprising:
   a plurality of memory devices; and
   a memory hub, comprising:
      a link interface for receiving memory requests for access to at least one of the memory devices;
      a self-test module coupled to the at least one memory device, the self-test module operable to generate a test signal based on a test parameter, the self-test module operable to transmit the test signal to the at least one of memory devices, receive a responsive signal from the at least one memory device, and determine a test result indicative of whether the at least one memory device responded correctly to the test signal, the self-test module comprising a maintenance bus interface operable to receive the test parameter and transmit the test result; and a first bus coupled between the memory module and the at least one memory device.

2. The memory module of claim 1 further comprising a maintenance bus coupled to the maintenance bus interface.

3. The memory module of claim 1 wherein the memory devices comprises a plurality of synchronous dynamic random access memory devices.

4. A memory module comprising:
a plurality of memory devices; and
a memory hub, comprising:
   a link interface for receiving memory requests for access to at least one of the memory devices;
   a self-test module coupled to the at least one memory device, the self-test module operable to transmit a test signal to the at least one of memory devices, receive a responsive signal from the at least one memory device, and determine a test result indicative of whether the at least one memory device responded correctly to the test signal, the test result comprising a frequency at which the at least one memory device operates correctly; and
   a first bus coupled between the memory module and the at least one memory device.

5. A memory module comprising:
a plurality of memory devices; and
a memory hub, comprising:
   a link interface for receiving memory requests for access to at least one of the memory devices;
   a self-test module coupled to the at least one memory device, the self-test module operable to transmit a test signal to the at least one of memory devices, receive a responsive signal from the at least one memory device, and determine a test result indicative of whether the at least one memory device responded correctly to the test signal, the test result comprising a timing skew at which the at least one memory device operates correctly; and
   a first bus coupled between the memory module and the at least one memory device.

6. A memory module comprising:
a plurality of memory devices; and
a memory hub, comprising:
   a link interface for receiving memory requests for access to at least one of the memory devices;
   a self-test module coupled to the at least one memory device the self-test module operable to transmit a test signal to the at least one of memory devices, receive a responsive signal from the at least one memory device, and determine a test result indicative of whether the at least one memory device responded correctly to the test signal, wherein the test signal is not carried on a bus other than the first bus; and
   a first bus coupled between the memory module and the at least one memory device.

7. A memory module comprising:
a plurality of memory devices; and
a memory hub, comprising:
   a link interface for receiving memory requests for access to at least one of the memory devices;
   a self-test module coupled to the at least one memory device, the self-test module operable to transmit a test signal comprising a series of corresponding first and second signals to the at least one of memory devices, wherein transmitting the test signal comprises coupling the series of corresponding first and second signals to the at least one memory device and altering the relative timing between when some of the corresponding first and second signals in the series are coupled to the at least one memory device, the self-test mode further operable to receive a responsive signal from the at least one memory device, and determine a test result indicative of whether the at least one memory device responded correctly to the test signal; and
   a first bus coupled between the memory module and the at least one memory device.

8. The memory module of claim 7, the responsive signal comprising output signals from the at least one memory device, the self-test module determining, based on the received output signals, whether the at least one memory device properly responded to the series of first and second signals.

9. The memory module of claim 8 wherein the self-test module further comprises:
a pattern generator producing a pattern of data bits each of which is used to generate a respective one the first signals in the series; and
a comparator coupled to the pattern generator and to the at least one memory device, the comparator receiving output signals from the at least one memory device and determining a pattern of data corresponding thereto, the comparator further comparing the pattern generated from the output signals to the pattern of data from which the first signals are generated.

10. The memory module of claim 9 wherein the self-test module further comprises a storage device coupled to the comparator to store the results of the comparisons between the pattern generated from the output signals and the pattern of data from which the first signals are generated.

11. The memory module of claim 8 wherein the self-test module comprises:
a delay line receiving a clock signal that is synchronized to the second signals in the series, the delay line being operable to generate from the clock signal a respective internal clock signal that is used to control the timing of when each of the first signals in the series is coupled to the at least one memory device;
a memory sequencer coupled to the at least one memory device, the memory sequencer being operable to generate and couple to at least one memory device a sequence of control signals to cause the at least one memory device to respond to each of the first and second signals in the series; and
a built-in self-test engine coupled to the delay line and to the memory sequencer operable to control the delay of the delay line.

12. The memory module of claim 11 wherein the self-test module further comprises a flip-flop having a data input receiving each of the first signals in the series, a clock input receiving the internal clock signal, and an output coupled to the at least one memory device.

13. The memory module of claim 11 wherein each of the first signals comprises a data signal and each of the second signals comprise a data strobe signal.

14. The memory module of claim 11 wherein the self-test module is further operable to couple a signal from the memory device corresponding to each of the output signals and to alter the relative timing between the signal coupled from the at least one memory device and the corresponding output signal.

15. A memory module comprising:
a plurality of memory devices; and
a memory hub comprising:
a link interface for receiving memory requests for access to at least one of the memory devices;
a clock generator operable to produce and couple to the at least one memory device a clock signal having a frequency;
a self-test module coupled to the at least one memory device and the clock generator, the self-test module operable to transmit a test signal to the at least one of memory devices, receive a responsive signal from the at least one memory device, and determine a test result indicative of whether the at least one memory device responded correctly to the test signal, the self-test module being further operable to vary the frequency of the clock signal over a range, the test signal comprising a series of first input signals and the responsive signal comprising a respective series of output signals from the at least one memory device, and the test result comprising an indicator of whether the at least one memory device properly responded to the series of first signals as the frequency of the clock signal is varied; and
a first bus coupled between the memory module and the at least one memory device.

16. The memory module of claim 15, wherein the self-test module further comprises:
a delay line coupled to receive the clock signal from the clock generator and being operable to generate a delayed internal clock signal; and
a flip-flop having a data input coupled to receive the first signal, a clock input coupled to receive the internal clock signal, and an output coupled to the at least one memory device.

17. A processor-based system, comprising:
a processor having a processor bus;
a system controller coupled to the processor bus, the system controller having a system memory port and a peripheral device port; and
a memory module coupled to the system memory port of the system controller, the memory module comprising:
a plurality of memory devices; and
a memory hub, comprising:
a link interface for receiving memory requests for access to at least one of the memory devices;
a self-test module coupled to the at least one memory device, the self-test module operable to transmit a test signal to the at least one of memory devices on a first bus receive a responsive signal from the at least one memory device, and determine a test result indicative of whether the at least one memory device responded correctly to the test signal; and
a second bus coupled between the memory hub and the at least one memory device, the second bus being different from the first bus.

18. The processor-based system of claim 17 wherein the self-test module generates the test signal based on a test parameter, the self-test module further comprising:
a maintenance bus interface operable to receive the test parameter and transmit the test result.

19. The processor-based system of claim 18 wherein the first bus is a maintenance bus and is coupled to the maintenance bus interface.

20. The processor-based system of claim 17 wherein the test result comprises a frequency at which the at least one memory device operates correctly.

21. The processor-based system of claim 17 wherein the test result comprises a timing skew at which the at least one memory device operates correctly.

22. The processor-based system of claim 17 wherein the test signal comprises a series of corresponding first and second signals, the self-test module being operable to couple the series of corresponding first and second signals to the at least one memory device and to alter the relative timing between when some of the corresponding first and second signals in the series are coupled to the at least one memory device.

23. The processor-based system of claim 22, the responsive signal comprising output signals from the at least one memory device, the self-test module determining, based on the received output signals, whether the at least one memory device properly responded to the series of first and second signals.

24. The processor-based system of claim 23 wherein the self-test module further comprises:
a pattern generator producing a pattern of data bits each of which is used to generate a respective one the first signals in the series; and
a comparator coupled to the pattern generator and to the at least one memory device, the comparator receiving output signals from the at least one memory device and determining a pattern of data corresponding thereto, the comparator further and comparing the pattern generated from the output signals to the pattern of data from which the first signals are generated.

25. The processor-based system of claim 24 wherein the self-test module further comprises a storage device coupled to the comparator to store the results of the comparisons between the pattern generated from the output signals and the pattern of data from which the first signals are generated.

26. The processor-based system of claim 23 wherein the self-test module comprises:
a delay line receiving a clock signal that is synchronized to the second signals in the series, the delay line being operable to generate from the clock signal a respective internal clock signal that is used to control the timing of when each of the first signals in the series is coupled to the at least one memory device;
a memory sequencer coupled to the at least one memory device, the memory sequencer being operable to generate and couple to at least one memory device a sequence of control signals to cause the at least one memory device to respond to each of the first and second signals in the series; and
a built-in self-test engine coupled to the delay line and to the memory sequencer operable to control the delay of the delay line.

27. The processor-based system of claim 26 wherein the self-test module further comprises a flip-flop having a data input receiving each of the first signals in the series, a clock input receiving the internal clock signal, and an output coupled to the at least one memory device.

28. The processor-based system of claim 26 wherein each of the first signals comprises a data signal and each of the second signals comprise a data strobe signal.

29. The processor-based system of claim 26 wherein the self-test module is further operable to couple a signal from the memory device corresponding to each of the output signals and to alter the relative timing between the signal coupled from the at least one memory device and the corresponding output signal.

30. The processor-based system of claim 17 wherein the memory devices comprises a plurality of synchronous dynamic random access memory devices.

31. The processor-based system of claim 17, the memory hub further comprising:
a clock generator operable to produce and couple to the at least one memory device a clock signal having a frequency; and
the self-test module coupled to the clock generator, the self-test module being further operable to vary the frequency of the clock signal over a range, the test signal comprising a series of first input signals and the responsive signal comprising a respective series of output signals from the at least one memory device, and the test result comprising an indicator of whether the at least one memory device properly responded to the series of first signals as the frequency of the clock signal is varied.

32. The memory module of claim 31, wherein the self-test module further comprises:
a delay line coupled to receive the clock signal from the clock generator and being operable to generate a delayed internal clock signal; and
a flip-flop having a data input coupled to receive the first signal, a clock input coupled to receive the internal clock signal, and an output coupled to the at least one memory device.

33. A method for testing in a memory system having a memory hub coupled to a plurality of memory devices, the method comprising:
generating testing signals in the memory hub;
coupling the testing signals from the memory hub to the memory devices and varying the relative timing between when the test signals are applied to the memory devices;
generating output signals in the memory devices resulting from the testing signals;
coupling the output signals from the memory devices to the memory hub; and
evaluating the output signals in the memory hub to determine if the memory devices properly responded to the test signals.

34. The method of claim 33 wherein the testing signals comprise data signals and corresponding data strobe signals.

35. The method of claim 34 wherein the act of generating testing signals in the memory hub comprises:
generating a pattern of data;
storing the pattern of data; and
producing write data bit signals from the data pattern.

36. The method of claim 35 wherein the act of generating output signals in the memory devices resulting from the testing signals comprise generating read data bit signals.

37. The method of claim 36 wherein the act of evaluating the output signals in the memory hub comprises:
determining a data pattern corresponding to the read data bit signals received from the memory devices; and
comparing the data pattern corresponding to the read data bit signals to the stored pattern of data.

38. The method of claim 33 wherein the testing signals comprise a command signal and a clock signal.

39. The method of claim 38 wherein the act of coupling the testing signals to the memory devices comprises coupling the command and the clock signal to at least one memory device while altering the relative timing between the command and the clock signal.

40. The method of claim 33 wherein the test signals comprise write data signals.

41. The method of claim 33 wherein the test signals comprise command signals.

42. A method for testing in a memory system having a memory hub coupled to a plurality of memory devices, the method comprising:
generating testing signals in the memory hub, wherein the testing signals comprise a clock signal having a variable frequency;
altering the frequency of the clock signal;
coupling the testing signals from the memory hub to the memory devices responsive to the clock signal;
generating output signals in the memory devices resulting from the testing signals;
coupling the output signals from the memory devices to the memory hub; and
evaluating the output signals in the memory hub to determine if the memory devices properly responded to the test signals.

43. A memory, comprising:
at least one memory device; and
a memory hub coupled to the at least one memory device, the memory hub including a self-test module configured to generate a plurality of test signals, transmit the plurality of test signals to the at least one memory device, alter at least one of a timing or a rate at which at least one of the plurality of test signals are transmitted to the at least one memory device relative to the other of the plurality of test signals, receive a plurality of responsive signals from the at least one memory device, and compare the plurality of generated test signals with the plurality of responsive signals to determine whether the at least one memory device is operating properly.

44. The memory of claim 43 wherein the memory hub further comprises a bus configured coupled to the self-test module and configured to be coupled to an external device.

45. The memory of claim 43 wherein the self-test mode comprises a pattern generator to configured to generate the plurality of test signal and a comparator to configured to compare the plurality of generated test signals with the plurality of responsive signals.

46. The memory of claim 43 wherein the self-test module further includes a clock generator configured to generate a clock signal having a frequency, the self-test module configured to vary the frequency of the clock signal over a range as the plurality of test signals are transmitted to the at least one memory device.

\* \* \* \* \*

UNITED STATES PATENT AND TRADEMARK OFFICE
CERTIFICATE OF CORRECTION

PATENT NO.         : 7,689,879 B2                                                   Page 1 of 1
APPLICATION NO.    : 11/431437
DATED              : March 30, 2010
INVENTOR(S)        : Joseph M. Jeddeloh It is certified that error appears in the above-identified patent and that said Letters Patent is hereby corrected as shown below:

On column 1, lines 8-9, after "continuation of" delete "pending U.S. patent application Ser. No. 10/660,844, filed Sep. 12, 2003." and insert -- U.S. patent application Ser. No. 10/660,844, filed Sep. 12, 2003, now patent no. 7,310,752 issued on Dec. 18, 2007. --, therefor.

In column 11, line 54, In Claim 6, delete "device" and insert -- device, --, therefor.

In column 13, line 56, In Claim 17, delete "bus" and insert -- bus, --, therefor.

Signed and Sealed this

First Day of June, 2010

David J. Kappos
*Director of the United States Patent and Trademark Office*